United States Patent [19]
Sherman

[11] Patent Number: 5,665,424
[45] Date of Patent: Sep. 9, 1997

[54] METHOD FOR MAKING GLASS ARTICLES HAVING A PERMANENT PROTECTIVE COATING

[76] Inventor: Dan Sherman, 540 Sand Dollar Dr., LaSelva Beach, Calif. 95076

[21] Appl. No.: 543,503

[22] Filed: Oct. 16, 1995

Related U.S. Application Data

[63] Continuation-in-part of Ser. No. 212,168, Mar. 11, 1994.

[51] Int. Cl.$^6$ .................................................. C23C 16/00
[52] U.S. Cl. .................. 427/109; 427/249; 427/255.1; 427/255.2; 65/60.8; 65/60.5
[58] Field of Search ................................. 427/109, 108, 427/166, 167, 255.1, 255.2, 255.3, 249; 65/60.8, 60.5

[56] References Cited

U.S. PATENT DOCUMENTS

| | | | |
|---|---|---|---|
| 3,438,801 | 4/1969 | Schlientz et al. | 117/88 |
| 3,445,280 | 5/1969 | Tokuyama et al. | 117/215 |
| 3,580,709 | 5/1971 | Banks | 65/30 |
| 3,582,395 | 6/1971 | Adams et al. | 117/124 |
| 3,660,061 | 5/1972 | Donley et al. | 65/32 |
| 3,717,498 | 2/1973 | Franz et al. | 117/70 A |
| 3,811,918 | 5/1974 | Levene | 117/47 H |
| 4,019,887 | 4/1977 | Kirkbride et al. | |
| 4,093,771 | 6/1978 | Goldstein et al. | 428/312 |
| 4,100,330 | 7/1978 | Donley . | |
| 4,159,206 | 6/1979 | Armbruster et al. | |
| 4,161,743 | 7/1979 | Yonezawa et al. | 357/54 |
| 4,188,444 | 2/1980 | Landau . | |
| 4,312,653 | 1/1982 | Schneider et al. | |
| 4,339,255 | 7/1982 | Ovshinsky et al. | 65/32 |
| 4,440,558 | 4/1984 | Nath et al. | 65/3.12 |
| 4,594,528 | 6/1986 | Kawakyu et al. | 313/503 |
| 4,670,033 | 6/1987 | Miura | 65/3.15 |
| 4,689,247 | 8/1987 | Doty et al. | 427/126.1 |
| 4,738,080 | 4/1988 | Stockebrand | 53/478 |
| 4,828,880 | 5/1989 | Jenkins et al. | |
| 4,871,695 | 10/1989 | Seki et al. | |
| 4,874,431 | 10/1989 | Fey et al. | 106/2 |
| 4,877,654 | 10/1989 | Wilson | 427/387 |
| 4,950,502 | 8/1990 | Saam et al. | 427/213.36 |
| 4,981,102 | 1/1991 | Gautreaux et al. | 118/725 |
| 5,013,788 | 5/1991 | Nagashima et al. | 524/767 |
| 5,022,905 | 6/1991 | Grundy et al. | 65/60.51 |
| 5,090,985 | 2/1992 | Soubeyrand et al. | 65/60.52 |
| 5,154,970 | 10/1992 | Kaplan et al. | 428/304.4 |
| 5,162,136 | 11/1992 | Blum et al. | 427/226 |
| 5,165,972 | 11/1992 | Porter . | |
| 5,217,753 | 6/1993 | Goodman et al. | 427/166 |
| 5,304,394 | 4/1994 | Sauvinet et al. | 427/166 |

FOREIGN PATENT DOCUMENTS

441705-A1  8/1991  European Pat. Off. .

OTHER PUBLICATIONS

"Silicon", McGraw–Hill Encyclopedia of Science and Technology, vol. 16, 6th Edition, 1987, pp. 405–412.

"Silicone Resins", McGraw–Hill Encyclopedia of Science and Technology, vol. 16, 6th Edition, 1987, pp. 412–413.

Auto Glass, New Product and Technologies Listing, "Asahi Glass to Supply Water–Repelling Window Glasses to Toyota for the Camry/Mark II," *JARI Courier*, vol. 13 No.1, Jan. 1994.

Eunique Design Resources, New Product Announcement, "Glass Coating", *Glass Digest*, vol.72 No.3 p.6, Mar. 15, 1993.

*Primary Examiner*—Roy V. King
*Attorney, Agent, or Firm*—Townsend and Townsend and Crew LLP

[57] ABSTRACT

A method of applying a protective coating (15) onto a surface (17) to be coated. The method includes providing a surface (17) to be coated, where the surface to be coated can be selected from a group consisting of a ceramic, a float glass, an artistic glass, a sandblasted glass, and a Pyrex glass product. The method also includes enclosing the surface to be coated in a temporary chamber. A step of introducing a silane and a carbon source into the temporary chamber is also included. The method further includes reacting the silane and the carbon source on the surface to be coated to form a surface coating (15) thereon.

28 Claims, 5 Drawing Sheets

METHOD FOR MAKING GLASS ARTICLES HAVING A PERMANENT PROTECTIVE COATING

CROSS-REFERENCE TO RELATED APPLICATIONS

This application is a continuation-in-part of application Ser. No. 08/212,168, filed Mar. 11, 1994, in the name of the present inventor.

BACKGROUND OF INVENTION

The present invention relates to protective coatings. More particularly, the invention is illustrated as a technique, including a method and structure, for coating glass and ceramic materials with a protective film. But it will be recognized that the invention also can be applied to almost any type of material to be coated.

In homes and building structures, maintaining cleanliness of glass or ceramic surfaces is a major problem. In particular, particles or residues, known as dirt and grime, attach themselves to surfaces of glass or ceramics on a variety of building structures, e.g., windows, tiles, bathroom fixtures, kitchen fixtures, etc. These particles or residues must be removed from surfaces of the structures to preserve their cleanliness. As is known, a "dirty" window is clearly difficult to see through on a sunny day. A dirty bathroom or kitchen fixture is unsightly and suggests health related problems.

Cleanliness of artistic glass is, at times, even more of a problem than conventional glass or ceramic surfaces. Artistic glass has designs made by sandblasting its surfaces. An example of an artistic glass can be found in glass shower doors. Portions of the shower door are sandblasted to maintain privacy for one taking the shower. Shower doors are exposed to hard-water, map scum, and oils from showering. Accordingly, the sandblasted surfaces, which are porous, easily accumulate residues from the hard-water, the soap scum, and the oils. Once the residues attach themselves onto the sandblasted surfaces, cleaning becomes even more difficult.

Conventional techniques for cleaning surfaces of glass or ceramic materials are often lengthy and rely upon expensive chemicals, e.g., surfactants, cleaning solutions, etc. One of these techniques includes steps of hand-wiping the surfaces with wipes and cleaning solution. A variety of cleaning solutions, which are often expensive, have been used or proposed by industry. Examples of these solutions can be found in the cleaning section of almost any grocery store. Despite the variety of cleaning solutions, surfaces of glass or ceramic materials still need cleaning.

Organic waxes or polishes have been used as protective coatings on surfaces of glass or ceramic materials. These coatings are designed to prevent residues from forming, especially on artistic glass surfaces. Upon application of the coating, surfaces of artistic glass remain clean when exposed to the environment for a brief period of time. As further time progresses, however, the coating oxidizes and loses its transparency. Further exposure to weather, temperatures above ambient, direct sunlight, or hot water degrades the coating into a dull finish. Therefore, the organic waxes and polishes must be stripped and reapplied frequently, which is time consuming and costly.

From the above, it is seen that a technique for preventing residues from forming on surfaces of glass or ceramic materials that is easy and effective is desirable.

SUMMARY OF THE INVENTION

The present invention provides a technique, including a method and structure, for fabrication of a protective coating on glass or ceramic surfaces. In particular, the invention provides a permanent transparent hydrophobic coating with a high carbon content that is easy to apply.

The coating is formed by reaction of a silane and a carbon source (which can be part of the silane) at ambient temperature and pressure. Preferably, the silane and carbon source are at low concentrations in gaseous states upon contact with a glass or ceramic surface. The coating can be applied to ordinary soda-lime float glass or to any other glass, glazed ceramic, glass-covered object having a surface formed primarily from silicon oxides. Techniques for applying the coating include CVD (chemical vapor deposition) at ambient temperature and pressure. This coating exhibits desirable scratch and dirt resistance.

The coating does not significantly alter optical properties of the uncoated glass. The optical properties generally include transmission, absorption, reflection of radiant energy in the visible, ultraviolet, and infrared bands. The coated glass surface has substantially the same optical properties to the naked eye as the corresponding uncoated glass. U.S. Pat. No. 3,660,061 has examples of various optical properties of glass that are available with the present invention.

Upon continuous exposure to hot sunlight, the coated glass article absorbs and reflects incident radiation almost exclusively at its coated surface rather than being distributed throughout its thickness. This features provides a glass structure that is less prone to undergo stresses, typically inducing fracture.

The coated surface contains relatively less oxygen and silicon than conventional glass. The coated surface also has more carbon than conventional glass, which provides resistance to chemical attack as indicated by accelerated salt spray testing. Outdoor exposure tests or weather resistance test (using the equivalent of a Sunshine Weather-O-Meter according to JIS D 0205 to measure the length of time elapsed before a change in appearance of the coating film is perceivable by visual observation) indicate substantially improved performance of the coated glass as compared to the conventional glass.

In one embodiment, the present invention provides an apparatus for applying a protective coating onto a surface to be coated. The apparatus includes a movable chamber attached to a surrounding surface adjacent to a surface to be coated. The removable chamber provides an enclosure to the surface to be coated. An inlet coupled to the movable chamber also is provided. The inlet is adapted to introduce a silane gas and a carbon source into the chamber.

Another embodiment provides a method of manufacturing an article. The article is selected from a group consisting of a window, windshield, tile, tile wall, bathroom fixture, artistic glass, and others. The method has a step of providing an article having a surface to be coated. The method then provides a step of enclosing the surface to be coated in a temporary chamber, and introducing a silane and a carbon source into the temporary chamber. A further step of reacting the silane and the carbon source on the surface to be coated to form a coating thereon is provided.

A further understanding of the nature and advantages of the present invention may be realized by reference to the latter portions of this specification and attached drawings.

DESCRIPTION OF SPECIFIC EMBODIMENTS

Figure 1:
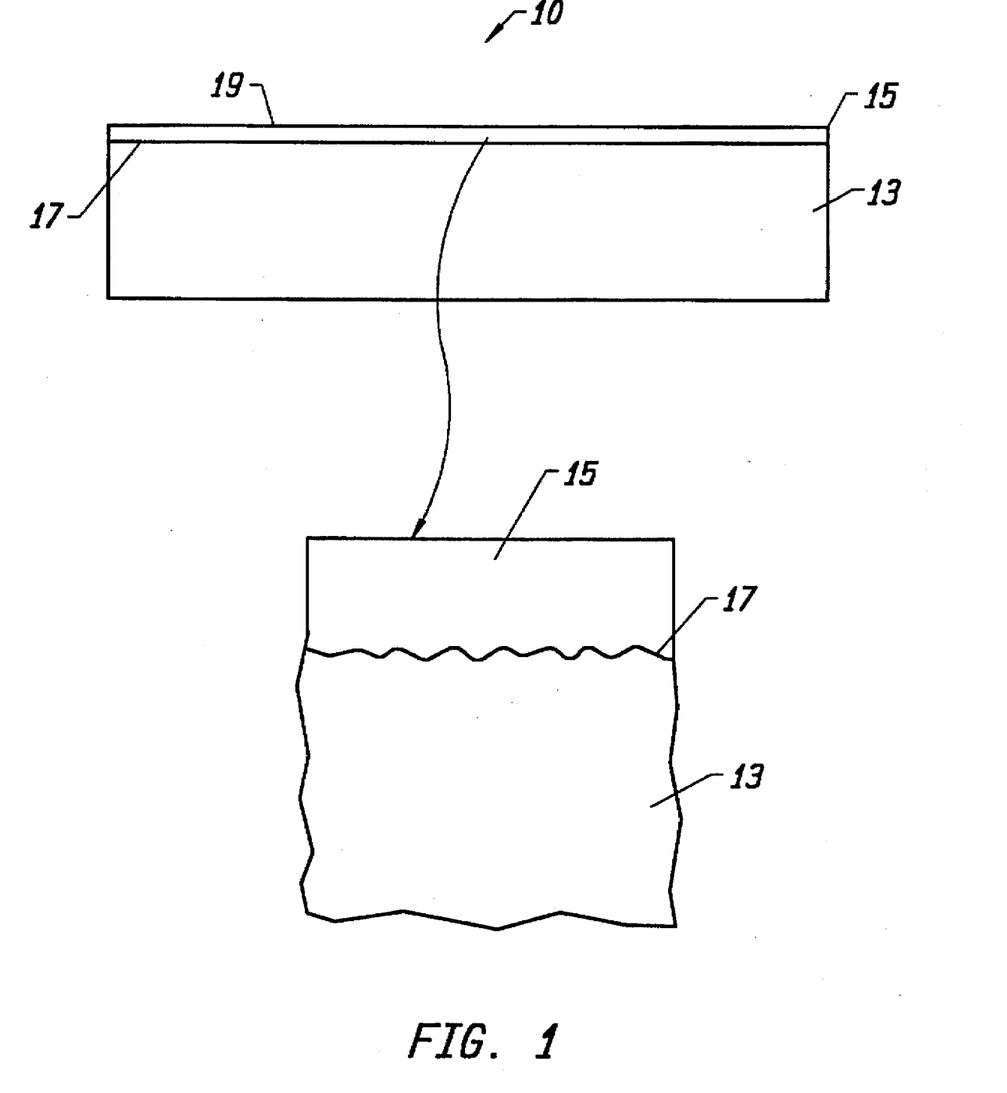
FIG. 1 is a simplified cross-sectional view diagram of a substrate according to the present invention.

FIG. 1 is a simplified cross-sectional view of an article according to the present invention. The article 10 includes a substrate 13 and an overlying protective layer 15. The substrate can be almost any type of glass or ceramic material. Preferably, the glass is an ordinary soda-lime glass or a ceramic material. An upper surface 17 of the glass is substantially free from unwanted organic and inorganic materials in order to provide formation of a uniform protective layer. The upper surface 17, without protective layer, is porous and traps residues and particles.

The protective layer is derived from chemical reagents including a silane and a carbon source. The chemical reagents are vaporized in a normal earth-type atmosphere, including oxygen, nitrogen, etc. with the upper surface 17 of glass containing some trace amounts of water. The chemical reagents and upper surface rapidly create a glass network structure, primarily made of silicon, carbon, and oxygen. The layer is rich in carbon and is similar to silicon-carbide, a hard, easy-to-clean material. As shown, the layer includes a substantially even upper profile 19 with SiC molecules, which tend to be hydrophobic. This layer keeps residues or particles from attaching to the underlying porous glass structure.

Figures 2A, 2B, 2C, 2D, 2E, 2F:
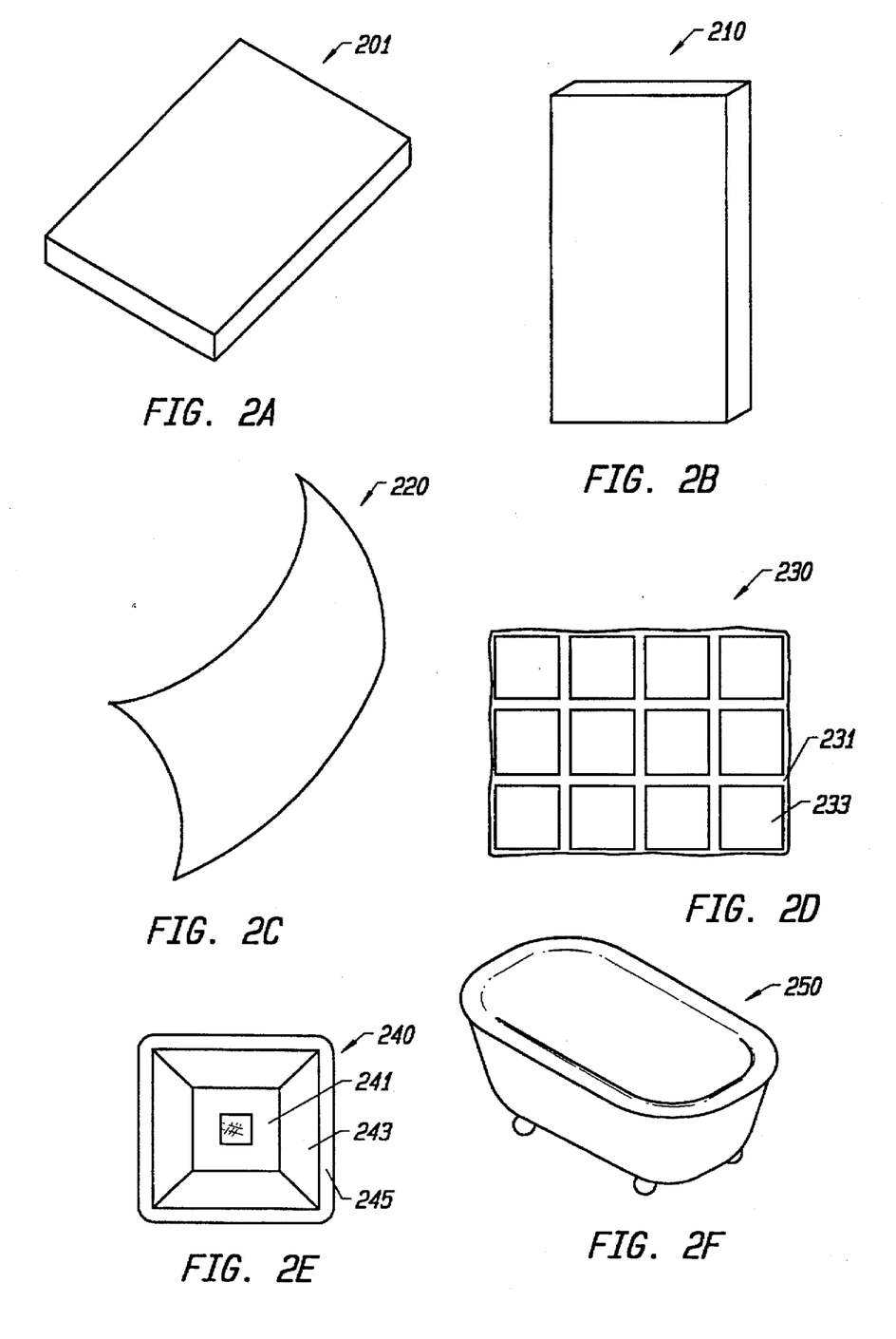
FIGS. 2A, 2B, 2C, 2D, 2E and 2F are articles made from the substrate of FIG. 1 according to alternative embodiments of the present invention.

FIGS. 2A to 2F are articles having the substrate and the protective layer of FIG. 1 according to alternative embodiments of the present invention. These articles include tile 201 as shown in FIG. 2A. This tile 201 can be made of a ceramic material, which cad be glazed or unglazed. FIG. 2B is a simplified diagram of a glass window 210. This window 210 can be made of any suitable material, typically used in the construction of buildings or the like. A vehicle window 220, commonly termed windshield, is illustrated by FIG. 2C. This window 220 is often concave or convex in shape and is mounted on an automobile, train, bus, airplane, boat, or any other moving vehicle. In an automobile, the window is often coated using a protective coating, but can also be un-coated. A wall 230, including mortar 231 and tile 233, is illustrated by FIG. 2D. The present coating layer can be applied to the wall to provide protection to both the mortar and tile. The wall is defined herein as any building structure using tiles, which also can include floors, counters, and the like. An artistic glass block 240 is shown by FIG. 2E. The artistic glass block 240 includes an outer periphery 245, an inner periphery 243, and a center section 241. The outer periphery 245 is often flat, but also can be bevelled. The inner periphery 243 is often bevelled, but also can be flat. The center section 241 is often flat, but can also be a variety of other shapes. Surfaces of the artistic glass are often sandblasted, and therefore porous. FIG. 2F is a bathroom fixture 250 made of a ceramic material. This bathroom fixture is a bathtab, but can also be a sink, toilet, or the like. Each of these articles has an underlying porous substrate with an overlying protective layer. The protective layer keeps particles or residues from attaching themselves to the uncoated exterior substrate surface. Of course, any other types of articles may also be coated depending upon the particular application.

A method according to the present invention may be briefly outlined as follows.

(1) Provide a substrate having a porous surface.
(2) Clean the porous substrate surface.
(3) Mask portions of the porous substrate surface.
(4) Form a protective coating on the porous surface by a silane process.

The method is merely a simplified illustration and should not limit the scope of the claims herein. Details with regard to the present method are illustrated in the Figs. below.

Figure 3:
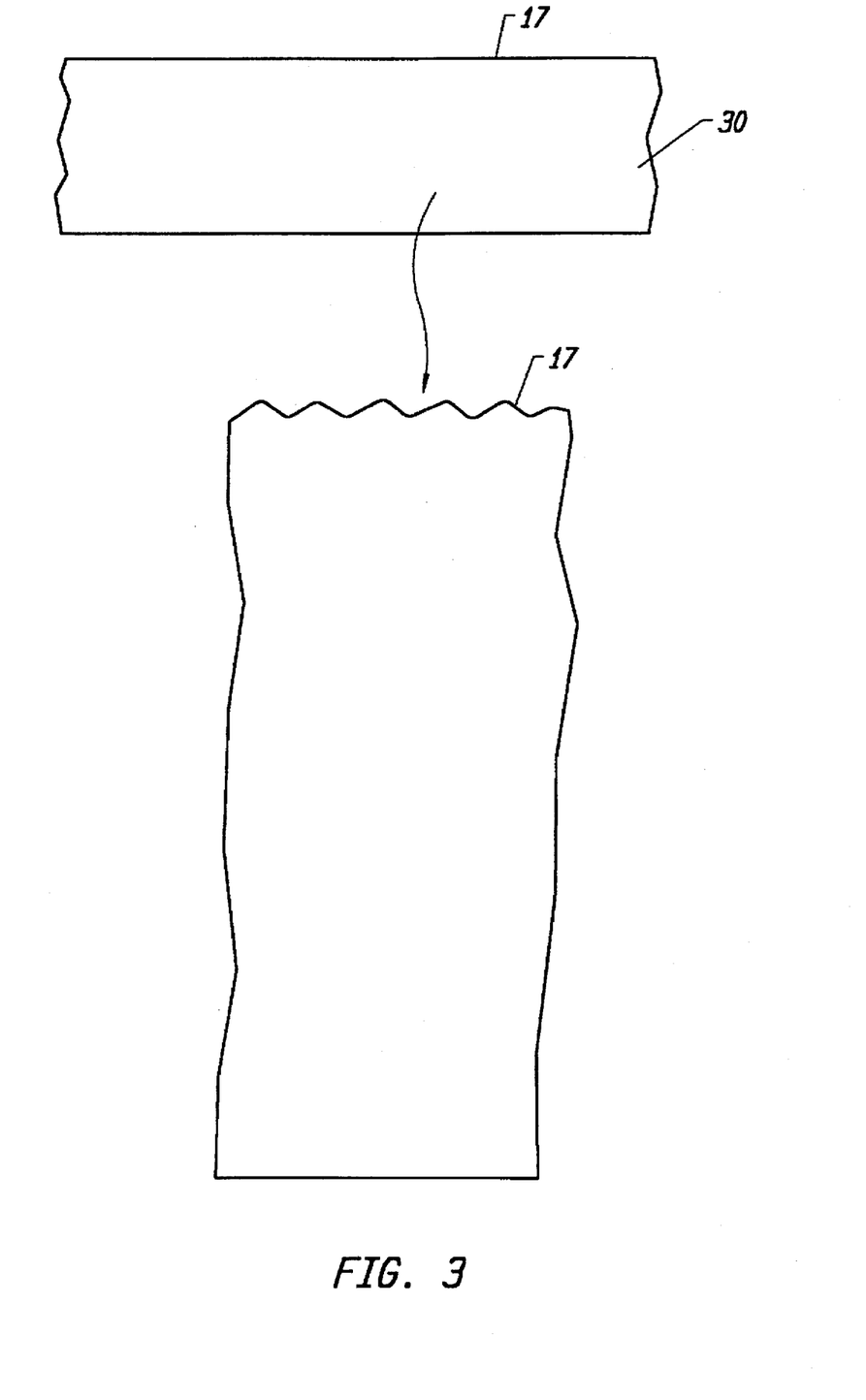
FIGS. 3, 4 and 5 illustrate a method according to the present invention.

The method begins by providing a substrate 30 as illustrated by FIG. 3. The substrate 30 is a glass or a ceramic material having a porous top surface 17. Preferably, the substrate is a soda-lime float glass. The substrate also can be any other glass, a glazed ceramic substrate, a glass-covered article, or any other article or object having a surface made primarily from silicon oxides and the like. A step of cleaning the top surface 17 eliminates any organic residues and particles, e.g., din, grime, etc. The organic residues can be finger prints, oils, and the like. The organic residues are often removed from the top surface because they mask the surface from exposure to reactant chemicals in later processing steps.

Cleaning the top surface can occur with a solvent and physical techniques, e.g., hand wiping, etc. Examples of these solvents include surfactants, alcohols, acids, amine catalyst, or the like. The amine catalyst can be pyridine and others. The solvent is applied with a clean-wipe, spray, or any other applicator. A brush, clean-wipe, or squeegee removes the residues and removes most of the solvent from the top surface. A step of air drying removes any residual solvent from the top surface. The air can be heated and even have a velocity component to enhance drying.

Preferably, cleaning occurs with an ammonia solution. In one embodiment, ammonia residues are left on the surface to provide a rich source of nitrogen for the reaction. This nitrogen reduces relative amounts of carbon and oxygen in the protective layer, thereby creating a protective layer with more silicon nitride. In an alternative embodiment, ammonia residues are removed from the surface through evaporation. This provides a protective layer that is substantially silicon-carbon and free from silicon nitride.

In a further alternative embodiment, a glass washer is used to clean the top surface of the substrate. Preferably, the glass washer cleans and air-dries the top surface, permitting excess water to evaporate without auxiliary heat. More preferably, the top surface is substantially dry before subsequent processes, especially since excess water requires greater volumes of reactants to form the protective film. The dry surface also prevents undesirable reaction by-products such as excessive hydrochloric acid (HCl) and others. HCl is corrosive and must be properly removed to ensure personal and environmental safety.

Optionally, selected portions of the top surface are masked. These masked portions will not be exposed to reactant chemicals during later process steps. Therefore, the masked portions will remain substantially free from the protective layer. After protective layer formation, the mask is removed, and unprotected surfaces will be exposed. The mask can be any suitable material such as tape, paint, or other masking agents. Of course, the type of mask used will depend upon the particular application.

Figure 4:
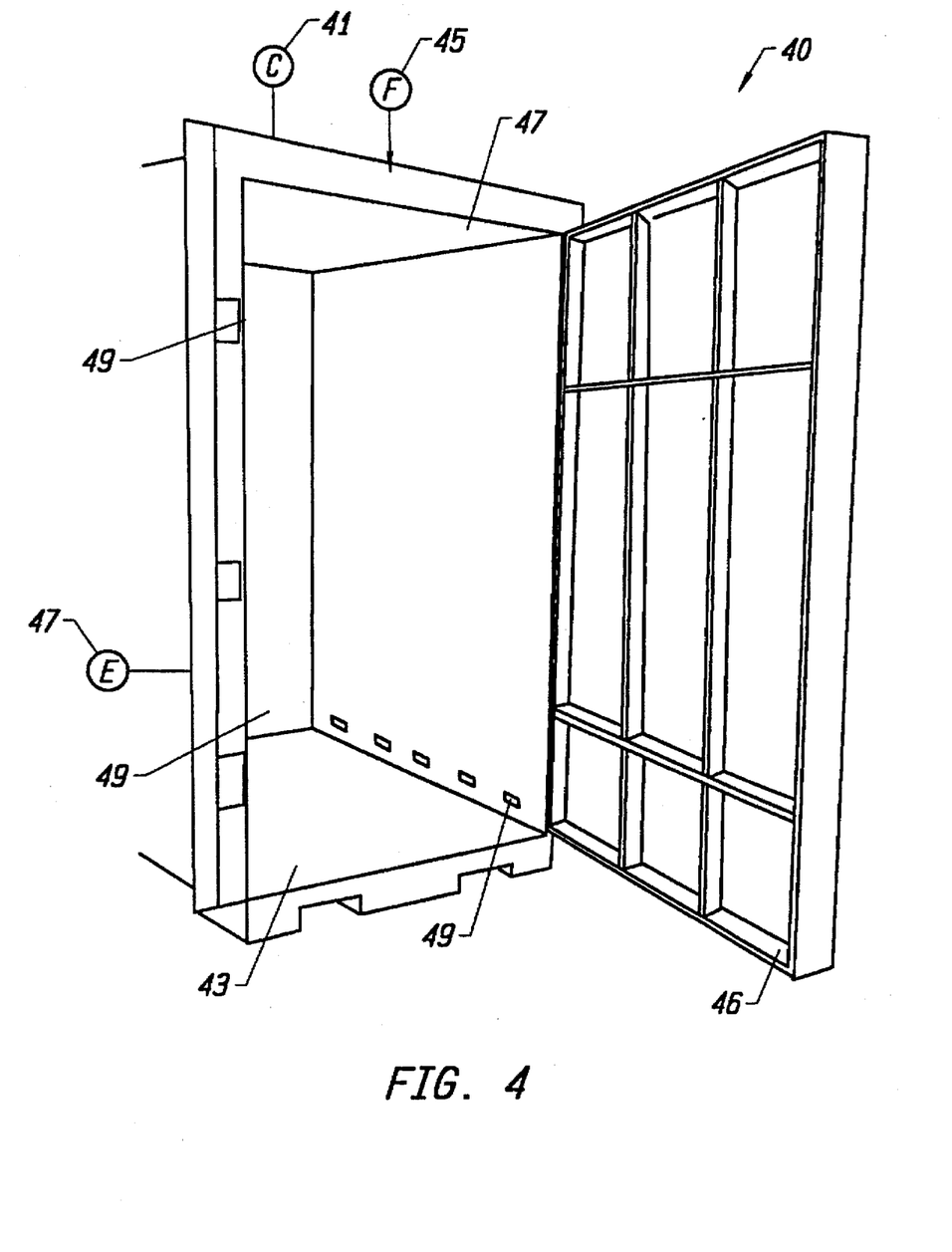

The cleaned substrate is placed into a process chamber to undergo deposition as illustrated by FIG. 4. The process chamber 40 can be any suitable enclosure for housing the substrate and containing process gases. The chamber includes a pedestal 43, a feed 45, an exhaust 47, distribution manifold openings 49, a door 46, a controller 41, and other elements.

Preferably, the chamber also includes an air or gas circulation system. The system can be a blower, ducting, or baffles used to create dynamic air movement around the substrate. Preferably, the air is filtered to eliminate particles greater than about 1.0 micron, and more preferably 0.5 micron and less. In one embodiment, the system circulates at least two volumes of air (i.e., the air in the chamber includes process gases) per minute, or preferably three or more volumes of air per minute. A volume of air is defined as the chamber volume. In a preferred embodiment, the system includes a flow rate of 800 cubic feet per minute in a chamber volume of 256 cubic feet. The chamber is also designed to enclose from about 200 to about 1000 square feet of substrate surface area for treatment.

Greater turbulence in the air flow enhances vaporization of the chemical reactants. This occurs because most reactants such as silanes are liquids at the process temperatures and pressures. Air turbulence also provides greater deposition uniformity. The chamber has a pressure ranging from 100 to 800 torr, and is preferably 700 to 800 torr, and is more preferably 760 to 800 torr. The pressure can be atmospheric or at a slight overpressure from the process of blowing filtered air into the chamber.

The substrate 10 is disposed on the pedestal 43. In one embodiment, the substrate is at a temperature ranging from 1° to 35° C. and is preferably 20° to 25° C. The substrate is at some relatively stable temperature (±5°) for at least 30 minutes. Lower substrate temperatures such as 0° C. and less may not produce durable coatings and higher substrate temperatures such as 36° C. and greater can produce excessively thin coatings that are prone to chemical attack. Generally, temperature also is adjusted to provide proper deposition rates. Of course, the exact temperature used depends upon the particular application.

Liquid chemicals are injected into an air stream flowing through the feed line 45. The injected liquids atomize and vaporize into gases and then mix with air. As an analogy, the liquids atomize and vaporize in a similar manner as gasoline in an automobile carburetor vaporizes in air before entry into cylinders in the engine for combustion. The air stream with vaporized liquids are free from liquid droplets. The liquid chemicals are liquid silanes. Gaseous silanes can be used, and do not need to undergo vaporization. Any liquid droplets often create adverse effects in the properties of the protective layer. The amount of process gases in air is often 1,000 times more than the amount that reacts on the substrate surface.

Figure 5:
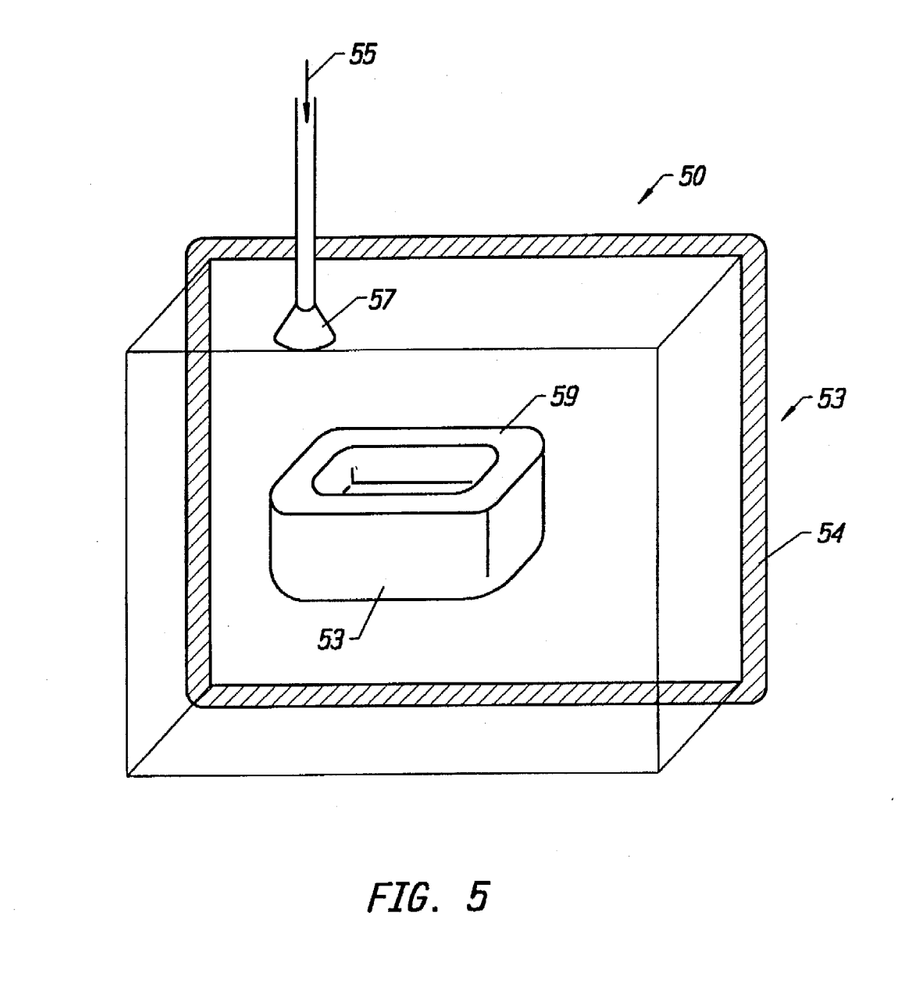

FIG. 5 is a simplified diagram of an alternative embodiment of a chamber 50. This chamber 50 is temporarily created adjacent to a surface 53 to be coated. A sheet of plastic such as vinyl, polyethylene, polypropylene, or the like can be attached to the surface with adhesive material 54 to define the chamber 50. The adhesive material can be tape, glue, or any other material that can seal the surface within the sheet. In preventing contaminants from entering the chamber, gas flows through the chamber to form a positive pressure. This pressure can be any suitable pressure about atmospheric pressure. Preferably, the pressure is 700 to 800 torr and greater.

Liquid chemical 55 injects into a gas distribution manifold 57. The distribution manifold 57 distributes vaporized chemical over the surface 53. A coating 59 forms overlying the surface 53. Liquid chemicals can be liquid silanes. Any liquid droplets may create adverse effects in the properties of the protective layer. The amount of process gases in air is often 1,000 times more than the amount that reacts on the substrate surface.

In one embodiment, the liquid silanes are introduced in selected quantities. The injected volume of liquid silane ranges from about 0.1 to about 3.0 µL, and is preferably about 0.3 µL in a 1,000 liter chamber. High volumes of liquid silane leave oily residue or film on the substrate surface. Of course, the exact volume of silane depends on the application.

Relative humidity within the chamber can be controlled according to an embodiment of the present invention. The relative humidity ranges from about 15 to 90% relatively humidity, and is more preferably about 40 to 70% relatively humidity. These ranges of relative humidity increase the reproducibility of the coating process. That is, the coating process becomes more stable as the amount of moisture in the chamber or relative humidity increases. Silane flow increases with increasing relative humidity.

Coating occurs using the following chemistry. A chemical reagent comprising a silane and a carbon source is vaporized in a normal earth-type atmosphere. This atmosphere includes oxygen, nitrogen, carbon dioxide, etc. The vaporized chemical reagent reacts with surfaces of porous glass. This glass includes trace quantities of water (and possibly alcohol or ammonia from a wash solution). Reaction creates a glass network structure or film made primarily of silicon, carbon, and oxygen. The film is rich in carbon and is similar to silicon-carbide. In an embodiment containing ammonia, more nitrogen (and less oxygen) exists in the silicon carbide/nitride film. Both films are harder than and are more resistant to alkali attack than ordinary soda lime glass. The films also are more hydrophobic, yet thin and transparent.

The coating process can create a film with a varying elemental composition. In particular, the composition can vary over a significant range and also can be less than a complete consolidation or coating of the porous glass surface while still imparting substantial protection. The thin silicon/carbon-containing composition of the coating surface has been identified by ESCA (Electron Spectroscopy of Chemical Analysis) and (AES) Auger Electron Spectroscopy for elemental composition information and chemical data, which is representative of the present films and set out in the examples that follow. Visual interpretation of SEM (Scanning Electron Microscopy) data at magnifications of 5,000x, 40,000x, and 150,000x revealed the approximate thickness of the coating to be 100–600 or preferably 200–400 Angstroms thick. Penetration into the surface of the glass is about the same distance, 100–600 Angstroms or preferably 200–400 Angstroms. These thicknesses result from the production processes used to date, and there is reason to believe that thicker coatings could be produced using other techniques (such multiple treatments or the use of catalysts to promote growth), although penetration distances into the original surface are not likely to be affected by techniques designed to provide a thicker surface layer.

The molar ratio of silicon to carbon in the coating can vary because of the ability of the two elements to replace each other in inorganic compositions (both are within group IV of the periodic table of the elements). While a normal glass surface might have a carbon content of less than one atom percent, surfaces of the invention have a carbon atom percent of at least 25% and preferably 35% to 55%. The atomic ratio of silicon to carbon in ordinary glass is generally 1000:1 or more, while in a glass surface of the invention the atom ratio of silicon to carbon is generally less than 1:1, and typically ranges from 2:3 to 1:3. The remainder of the components on the surface are those normally present in glass surfaces, such as magnesium, calcium, oxygen, sodium, and zinc. Although most of these elements will be present as a result of the production of the glass and are therefore not specifically related to the treatment process of the invention, some metal ions or organic components may be present as a result of the use of ordinary atmospheric air in the coating process (as described below), as such air can contain elements resulting from industrial pollution. Other metal ions can migrate from the glass composition as it was formed during manufacture into the surface itself. Typical surface layers of the invention (especially the top 100 Angstroms of the surface) can contain from 0–1% magnesium, 0–1% calcium, 0–0.75% tin, 0–0.75% zinc, and 0–2% sodium, with the silicon and carbon content being as previously defined and the remainder being oxygen. Specific examples of compositions of the invention are set forth below.

The more satisfactory coatings have a higher carbon content and a lesser corresponding amount of oxygen and silicon. The amounts of carbon is typically 10 times greater than is found in ordinary soda-lime glass, while the amounts of oxygen found is about 50%, and the amounts of silicon found is also reduced to about half of that in ordinary soda-lime glass.

The coating applied by pyrolysis (high temperature) techniques of the prior art is considerably more dense, homogeneous, and uniform than the film of the invention deposited at ambient temperatures by CVD methods, and the prior art coatings produced by pyrolysis have a different chemical composition. For this reason, subsequent depositions (such as productions of metal films) using pyrolysis methods at elevated temperatures on ambient CVD films of the invention have uniformity and adhesion problems caused by the irregular elemental composition of the films (surfaces of the invention). Nevertheless, the surface films of the invention are perfectly suitable for the indicated uses where no high-temperature deposition techniques will be used after the film is formed.

It was discovered that the chemicals used in the cleaning process add elements during the creation of the film so as to produce different film compositions, all of which still have satisfactory characteristics for the functional application intended in this invention. This was later verified by controlled experimentation. The coatings produced when the glass surface has been prepared with cleaning solutions containing acetic acid, alcohol, or ammonia and water as the majority component are all elementally different when analyzed by ESCA, yet function equally well to reduce the entry of foreign debris into the surface of patterned glass. These cleaning solutions are sources for oxygen (e.g., $O_2$, $H_2O$) and nitrogen (e.g., $N_2H_4$, $NH_3$) elements when the coating is formed.

The present coating resembles a silicon carbide from chemical reactants. As reactants, the invention uses a silane compound that can react with hydroxide groups in water and/or in the silica in the surface of the glass. No particular reactivity of the carbon source appears to be necessary, since alkanes can be used as the carbon source. Whatever the mechanism of the remaining steps, reactions continue so as to produce a surface rich in carbon and silicon and relatively depleted in oxygen. The surface may contain silicon carbides (SIC), but the invention is not limited to the SiC structures because of the ability of silicon and carbon to be present in other (often non-stoichiometric) ratios in inorganic compositions. Silanes are silicon analogues of organic compounds based on carbon. The word "silane" is generally used to mean compounds in which the silicon atom is bonded to other atoms by single bonds in contrast to, for example, siloxanes, which have a Si-O double bond. Silanes capable of reacting with water to form the surfaces described here will typically have at least one hydrogen or halogen atom directly attached to silicon, although more complex molecules, such as alkoxide derivatives, can be used. For the purposes of this invention, preferred silanes are those of the formula $Si_nH_{2n+2}$ (the silicon analogue of an alkane) as well as derivatives thereof in which one or more hydrogen atom is replaced by a halogen atom (preferably by a chlorine atom) or by an alkyl or alkoxy group (especially an alkyl group; alkyl groups, whether as themselves or in an alkoxy group preferably have 4 or fewer carbons, more preferably 1 or 2 carbons, especially methyl). Compounds having a higher vapor pressure at the temperature being used for the coating process are preferred over other silanes of similar formula but with lower vapor pressures. Silane itself ($SiH_4$) is a gas at the temperatures used here, as are a number of the other lower-molecular-weight silanes (such as chloro- and dichlorosilane; boiling points $-30°$ and $8°$ C., respectively). Gaseous silanes can readily be used, although they are not as easy to store as silanes that are liquids at ambient temperature. However, the gaseous silanes are not as limited in terms of the upper limit of concentration that can be used (see below) as they do not condense on the glass surface.

For the sake of simplicity, all silanes used in gaseous form under the conditions of the process of the invention are referred to as "vapors" even if not formed by evaporation from a liquid silane.

A number of silane formulations (including $SiH_4$, $SiH_3Cl$, $SiHCl_3$, and $Me_2Cl_2Si$) were evaluated to discover which ones provided the best glass surface films. Complex or hazardous solvents necessary to transport the elemental compounds can be used but are usually avoided because of expense and toxicity, and commercially available silane mixtures are used as preferred compositions. However, silanes can present a health problem if not properly used, and manufacturer's instructions for safety should be carefully followed.

It is necessary to use a carbon-containing carrier gas such as butane or another hydrocarbon gas concurrently with silane compounds that do not contain carbon in order to create the silicon-carbide-containing film of the invention. Any hydrocarbon compound that is a gas under the conditions used in the deposition process (set out above) can be used as the carbon source; such hydrocarbons typically contain 5 carbons or fewer, more generally 4 carbons or fewer. Typical examples are methane, ethane, propane, butane (including both of its isomers), and neopentane as well as unsaturated hydrocarbons such as ethylene and acetylene. Other simple carbon compounds that are either gaseous or that have high vapor pressure at the ambient temperatures described here, such as dimethyl ether and diethyl ether, can also be used. If the silane compound already contains carbon, no carrier is required, as the silane also functions as the carbon source. Preferred silane compounds contain two or more carbon atoms per silicon atom and do not contain oxygen. Hydrogen can be used as a carrier, but several experiments showed that the potential flammability hazards of this process would be high and objectionable, so such processes are not preferred. In preferred embodiments, the carrier gas is simply filtered, clean atmospheric air.

Dichlorodimethylsilane, 99% $(CH_3)_2SiCl_2$ as available commercially, was used in some preferred embodiments. It was found that this material, combined in very small proportions with air, reacted with the water in the glass substrate to produce a silicon/carbon film which had the desired properties for a transparent protective film of the invention. Additional experiments proved the process to be inexact and have a wide latitude of acceptable conditions to create a satisfactory coating with a minimum of safety precautions required.

Experiments with the ratio of liquid silane solution to air or carrier gases such as butane, ether, and propane have been done over a wide range to discovery definite preferable compositions. Excessive liquid compound quantities are considered to be any amount that produces greater than 1 part vapor to 10,000 parts of atmosphere (V/V), with the liquid requiring vaporization in this ratio prior to contacting the glass surface. Preferred initial ratios (subject to adjustment for the particular chamber used as described elsewhere) are in the range of from $1:10^7$ to $30:10^6$. The upper limit for any set of working conditions can be readily determined from the condition of the film that forms on the glass. When sufficiently great quantities of silane are present so that liquid silane collects on the glass surface, the resultant crystalline surface structures are very fragile, becoming functionally ineffective to provide the protective film this invention describes. A dichlorodimethylsilane-rich mixture produces a surface that is very similar to other polymer-type coatings that are temporary and ablative when exposed to an aggressive environment. The coating applied by the dichlorodimethylsilane-rich mixture can, however, be removed from the glass surface using a solvent, then wiped with alcohol in a solution containing 50% water, and allowed to air-dry before re-applying a satisfactory coating in the prescribed manner.

Typical lower limits of the silane compound are from about 1 to about 3 parts per million of circulating air. Lower concentrations have not been likely to produce uniform and complete film growth, although it may be possible to design reaction chambers to allow use of such low concentrations. It appears that the silane reacts with the surface of the chamber and possibly with water adsorbed on the chamber surface, thereby removing the silane from the atmosphere in the chamber before it can react with the glass. Excess water on the surface of the glass can also increase the amount of silane needed. Accordingly, a minimum amount of the silane must be present before any silane remains to react with the glass surface. As previously indicated, both the upper and lower limits of the ratio of the silicon-containing compound to the circulating air can best be determined by experimentation for the chamber actually being used. In such experimentation, actual limits for future use would be determined by selecting for a given chamber design one of the limits (upper or lower) as described herein as a starting point for the investigation and then carrying out the reaction as described. If, for example, inadequate coverage is seen for a lower limit, the actual working lower limit for that chamber would be higher, and the next experimental run would simply increase the amount of silicon-containing compound and/or carbon-containing compound in the circulating atmosphere until adequate coverage was obtained.

The invention now being generally described, the same will be better understood by reference to the following detailed examples, which are presented for illustration and are not intended to limit the invention.

EXAMPLES

Example 1

Testing procedures to determine functional properties of surface films

Films prepared according to the method of the invention (or other films prepared in evaluations of modifications of the specific examples given here) can be evaluated for water repellency and durability of the surface using a series of steps. The tests used in evaluating the films of the invention are set out below (other tests common to the glass industry can be used instead of these tests if more readily available to a potential manufacturer).

Phase 1: Initial manual and visual testing of a fresh coating:
  Step 1—Water repellency: a drop of deionized water pools like mercury, runs off without leaving traces.
  Step 2—Tactile feel: slippery to the touch, smooth, no rough edges, will not scratch off.
  Step 3—Transparency: optically non-distorting visual image is visible through the glass.
  Step 4—Abrasion resistance: polish to see if coating discolors, cracks, peels, or is abraded or removed.

Phase 2: Further testing procedures:
  Step 1—Heat resistance: tap water from hot side running over sample for 1 minute.
  Step 2—Abrasion resistance: rub dry and look for coating to come off after heat and friction of rub.
  Step 3—Resistance to exposure to sunlight: water spray every 4 hours; note evaporation effects; look for water marks after 40 hours of continuous exposure.
  Step 4—Heat resistance: pressure cook at 240° F. for 1, 2, 4, 8, 16, 24 hour steps; examine after each step; if OK proceed, if defective stop and note results.
  Step 5—Use resistance: put into shower, subject to soap scum exposure, warm water, repeated daily; note any build-up; mask and clean part of exposed area weekly for 5 weeks.
  Step 6—Salt water spray and weather exposure: extended testing for adhesion, discoloration, cracking, chemical attack and penetration, durability of coating.

Example 2

Glass cleaning techniques

A variety of different glass cleaning techniques were used in the following examples. These techniques, referred to by identifying letters, are set out below.

Process A: Initial glass cleaning procedure
  1. Clean glass with 50% isopropyl alcohol solution and deionized water using paper towel.
  2. Let sample air dry at room temperature in a draft-free place.
  3. Put in a desiccated storage box for temperature and humidity conditioning for 12 to 24 hours.
  4. Put in a reduced pressure chamber (0.1 Torr) at 25° C. for 12 hours with a nitrogen flow of 25 SCCM.

Process B: Subsequent glass cleaning procedure
  As in Process A, but delete Step 4; very little coating difference was noted between glass samples completely dry in a vacuum chamber and under a nitrogen stream and those left at room temperature and nominal humidity.

Process C: Modified cleaning procedure
  1. Clean glass with 30% ammonia solution and deionized water using paper towel.
  2. Let sample dry in filtered clean chamber with ambient room temperature air and nominal relative humidity; no forced air circulation.

Process D: Modified subsequent cleaning procedure
  Glass has been temperature stabilized at 20° C. for minimum of 8 hours. Delete Step 3 of Process A.
  1. Clean glass with 10% methylene chloride (CH2Cl2) and deionized water.
  2. Repeat cleaning with 20% alcohol solution and deionized water.
  3. Let sample dry in a draft-free location at room temperature (20° C.) and nominal relative humidity; no forced air circulation.

Process E: Variations to cleaning procedure to evaluate coating results
1. Control relative humidity of environmental chamber to affect water content of sample.
2. Control temperature of chamber to condition sample prior to coating.
3. Control of temperature (±1° C.) and relative humidity (±5%) prior to coating.

Example 3

Preparation of film on glass (first comparative example)

A 6-mm thick soda-lime float glass sample was cleaned (method B) with an alcohol and water solution, then left to air dry in a desiccated chamber having a relative humidity of 50% at ambient temperatures (20° C.) for 12 hours.

The cleaned sample was positioned in a reaction chamber at atmospheric pressure where filtered air was directed over it and recirculated within the chamber. The pressure in the chamber was raised slightly by the addition of the filtered air in the sealed chamber.

A liquid $C_2H_6Cl_2Si$ compound was introduced into the chamber in the ratio of about $1:1\times10^5$ and allowed to circulate for 5 minutes. This concentration was sufficiently high so that the liquid condensed on the sample. The chamber was then evacuated, refilled with nitrogen, and purged in this manner several times.

The sample was removed and noted to have been coated with an oily film where the liquid compound dripped on the surface prior to reacting with the moisture in the glass and the chamber atmosphere. Tested per Example 1, Phase 1. In view of these poor results, higher level tests were not conducted.

Example 4

Preparation of film on glass (second comparative example)

A conditioned sample was placed in the chamber as in Example 3. The chamber was modified in incorporate deflectors to circulate the air and distribute the liquid $C_2H_6Cl_2Si$ compound better than previously.

The liquid was injected as an atomized mist, rather than drops, into the chamber in the ratio of $\sim1:1\times10^6$ in the same process as before. The chamber was evacuated and purged after 5 minutes and the sample removed. It had no evidence of the oily coating previously noticed.

The sample was subject to water repellency testing (Example 1, Phase 1) which indicated some hydrophobic properties. However, the film was still not satisfactory in terms of strength and permanency.

Example 5

Preparation of film on glass (third comparative example)

The same conditions as in Example 4, except the ratio was adjusted to ~30 liquid $C_2H_6Cl_2Si$ compound: air $1\times10^5$ by volume.

The chamber Was evacuated and purged after 5 minutes and the sample removed.

The sample was then subjected to water repellency testing (Example 1, Phase 1), which indicated improved hydrophobic properties compared to Example 4, but was still not satisfactory as a permanent film.

Example 6

Preparation of film on glass (fourth comparative example)

The sample was cleaned with alcohol and stored in an air-tight container for 12 hours. It was then positioned in the chamber having deflectors for improved air circulation where it was subject to filtered air with a relative humidity of 10% at 20° C.

A solution of $C_2H_6Cl_2Si$ was injected into the circulating air within the chamber in the ratio of $30:1\times10^7$. The chamber was evacuated and purged after 5 minutes and the sample removed.

The sample was then subjected to water repellency testing which indicated reduced hydrophobic properties compared to previous samples, but still not at the desired level of permanency.

Example 7

Preparation of film on glass (fifth comparative example)

The same conditions as Example 6 but adjusting the ratio to $1:1\times10^6$.

The sample was then subjected to water repellency testing which indicated improved hydrophobic properties, compared to Example 6 but still not at the desired level of permanency.

Example 8

Preparation of film on glass (sixth comparative example)

The same conditions as Example 6 but adjusting the ratio to $30:1\times10^6$.

The sample was then subjected to water repellency testing which indicated improved hydrophobic properties compared to Example 7 and equal to Example 5.

Example 9

Preparation of silicon-carbon film on glass (embodiment of the invention)

The sample was cleaned with an ammonia and water solution (method C) to be analyzed for elemental composition. Used Example 8 conditions with the ratio $30:1\times10^6$. A permanent film of the invention was obtained. Unfortunately, the moisture content of the glass surface being treated was not measured, so the reason for forming a permanent film in this example and not in Example 8 is uncertain. It is believed, however, to be due to the different cleaning techniques, which may have resulted in different water contents on the surface of the glass at the time of the coating process. This example shows the importance of adjusting operating conditions empirically so as to select the right amount of silane.

Example 10

Preparation of silicon-carbon film on glass (embodiment of the invention)

An alcohol-cleaned sample (method B) was conditioned at 5° for 12 hours at 50% relative humidity then subjected to coating with a $30:1\times10^7$ liquid $C_2H_6Cl_2Si$ compound air. The chamber was evacuated and purged after 5 minutes and the sample removed. The sample was then subjected to water repellency testing which indicated improved hydrophobic properties, better than found with Example 5 and similar to those of Example 9. This example shows that controlling the humidity and other conditions responsible for the water content of the glass and chamber surfaces allows predictable and reproducible results.

Example 11

Preparation of silicon-carbon film on glass (embodiment of the invention)

Samples cleaned (method B) and temperature-conditioned at 10°, 15°, 20°, 25°, and 30° C. were coated with the same ratio, 30:1×10⁷ liquid $C_2H_6Cl_2Si$ compound: air. All showed improved properties when tested per Example 1, Phase 1 and 2, Steps 1, 2, 3, 4, and 5 and had the permanency of the samples produced in Examples 9 and 10.

Example 12

Preparation of silicon-carbon film on glass (embodiment of the invention)

Alcohol-cleaned samples (method B) were humidity-conditioned at 25° C. ranging from 10% to 75% relative humidity, in 5% increments, for 24 hours, then coated with liquid $C_2H_6Cl_2Si$ compound at the ratio of 30:1×10⁷.

The 65% and 70% RH samples did not have as good hydrophobic properties as those with the lower RH which were coated when tested per Example 1, Phase 1 and 2, Steps 1, 2, 3, 4, and 5. This example, together with Examples 10 and 12, shows the desirability of humidity control when reproducible effects are desired for high-volume production.

Example 13

Preparation of silicon-carbon film on glass (embodiment of the invention)

Repeated Example 12 with 65%, 70%, 75% RH samples at 25° C. for 24 hours. Same ratio for liquid $C_2H_6Cl_2Si$ compound. No change when tested per Example 1, Phase 1 and 2, Steps 1, 2, 3, 4, and 5.

Example 14

Chemical analysis of surface films on glass

Three samples of coated float glass that were prepared by the method of the invention were analyzed by ESCA for the chemical content of their surfaces. Results are shown in the table below, which includes a comparison to plain glass prior to coating.

| Element | Plain Glass | Coated Samples* | | |
|---|---|---|---|---|
| Silicon | 53** | 17 | 21 | 26 |
| Carbon | 0.3 | 53 | 45 | 38 |
| Magnesium | 1.6 | 0 | 0.6 | 0 |
| Calcium | 3 | 0.5 | 0.7 | 0.5 |
| Tin | 0.1 | 0 | 0.4 | 0.2 |
| Oxygen | 36 | 28 | 31 | 35 |
| Nickel | 0.3 | 0 | 0 | 0 |
| Zinc | 0.7 | 0.4 | 0 | 0 |
| Sodium | 4 | 1.1 | 1.3 | 0.3 |

*The first two coated samples (17 and 21% silicon) were prepared as described in Example 10. The third sample was prepared as described in Example 9.
**All values in atom %

All publications and patent applications mentioned in this specification are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed is:

1. A method of applying a protective coating onto a surface to be coated, said method comprising:

providing a surface to be coated, said surface to be coated is selected from the group consisting of a ceramic, a float glass, an artistic glass, a sandblasted glass, and a Pyrex glass product, said surface to be coated having adjacent thereto a surrounding surface;

enclosing said surface to be coated in a temporary chamber, said temporary chamber being coupled to said surrounding surface to substantially prevent contaminants from entering into said temporary chamber;

introducing a silane and a carbon source into said temporary chamber at a pressure of about 700 Torr and less, and at a temperature ranging from 1° to about 35° C.; and reacting said silane and said carbon source on said surface to be coated to form said protective coating thereon.

2. The method of claim 1 wherein said temporary chamber is attached to said surrounding surface with an adhesive material.

3. The method of claim 1 wherein said surface coating is substantially transparent.

4. The method of claim 1 wherein said surface coating includes 35 to 55 atom % carbon, 15 to 30 atom % silicon, and no more than 10 atom % elements other than silicon, oxygen, and carbon.

5. The method of claim 1 wherein said surface to be coated is on an article which is selected from the group consisting of a window, windshield, tile, tile wall, bathroom fixture, and artistic glass block.

6. The method of claim 1 wherein said temporary chamber is made of a plastic material.

7. The method of claim 6 wherein said plastic material is selected from the group consisting of vinyl, polypropylene, polyethylene, fiber glass, teflon, and polyvinylchloride.

8. The method of claim 1 wherein said temporary chamber is provided at a positive pressure during said introducing step.

9. A method of manufacturing an article, said article selected from the group consisting of a window, windshield, tile, tile wall, bathroom fixture, and artistic glass, said method comprising:

providing said article, said article having a surface to be coated and a surrounding surface adjacent thereto;

enclosing said surface to be coated in a temporary chamber, said temporary chamber being coupled to said surrounding surface to substantially prevent contaminants from entering into said temporary chamber;

introducing a silane and a carbon source into said temporary chamber at a pressure of about 700 Torr or greater and at a temperature ranging from 1° to about 35° C.; and reacting said silane and said carbon source on said surface to be coated to form a coating thereon.

10. The method of claim 9 wherein said article is made of a material selected from the group consisting of a ceramic, a float glass, an artistic glass, a sandblasted glass, and a Pyrex glass product.

11. A method for producing a coated glass or ceramic article having a surface formed from silicates, said article being selected from the group consisting of a sandblasted glass, an artistic glass, a float glass, and a Pyrex glass product, said method comprising the steps of:

contacting an uncoated glass or ceramic article in a gaseous atmosphere at a pressure of at least 700 Torr with a silane vapor and a gaseous carbon source for a sufficient time at a temperature ranging from 1° to about 35° C. to form a coating on and in the glass or ceramic surface, wherein said coating comprises a silicon-carbide-containing layer having a thickness of at least 100 angstroms and containing 35 to 55 atom % carbon, between 15 and 30 atom silicon, no more than 10 atom % elements other than silicon, and carbon, and the remainder oxygen.

12. The method of claim 11, wherein said silane vapor is dichlorodimethysilane, said article being at a temperature ranging from about 20° to about 25° C.

13. The method of claim 11, wherein said silane vapor and air are present in a volumetric ratio of from $1:10^7$ to $30:10^6$.

14. A method of coating an article with a substantially transparent surface coating, said method comprising steps of:

providing said article comprising a surface material selected from the group consisting of a sandblasted glass, an artistic glass, a float glass, a Pyrex glass product, and a ceramic material; and reacting a silane and a carbon source at a temperature ranging from 1° to about 35° C. on said surface material to form said substantially transparent surface coating on said article;

wherein said reacting step being provided in a temporary chamber, said temporary chamber being coupled to a surrounding surface adjacent to said article to substantially prevent contaminants from entering into said temporary chamber.

15. The method of claim 14 further comprising a step of washing said surface material with an ammonia solution.

16. The method of claim 14 further comprising a step of washing said surface material with an alcohol solution.

17. The method of claim 14 wherein said surface material is at a temperature ranging from about 20° to about 25° C.

18. The method of claim 17 wherein said surface material is within about 5° C. of said temperature for at least 30 minutes.

19. The method of claim 14 wherein said chamber provides for a flow of said silane and said carbon source around said surface material.

20. The method of claim 14 wherein said chamber provides for a turbulent flow of said silane and said carbon source around said surface material.

21. The method of claim 20 wherein said flow includes a flow rate replacing at least two volumes of said temporary chamber volume per minute.

22. The method of claim 20 wherein said flow includes a flow rate of about 800 cubic feet per minute, and said chamber includes a volume of about 256 cubic feet.

23. The method of claim 14 wherein said chamber is at a pressure ranging from about 600 to about 800 torr.

24. The method of claim 14 wherein said silane vapor is from a liquid silane.

25. The method of claim 14 wherein said transparent surface coating reflects incident radiation substantially at an outer surface region.

26. The method of claim 14 wherein said transparent surface coating includes substantially the same visual optical properties as said surface material.

27. The method of claim 14 wherein said surface material is substantially free from organic materials.

28. The method of claim 14 wherein said surface material is substantially free from inorganic materials.

* * * * *